(12) United States Patent
Kitagawa

(10) Patent No.: US 11,749,329 B1
(45) Date of Patent: Sep. 5, 2023

(54) OFF-STATE WORD LINE VOLTAGE CONTROL FOR FIXED PLATE VOLTAGE OPERATION

(71) Applicant: Micron Technology, Inc., Boise, ID (US)

(72) Inventor: Makoto Kitagawa, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/749,401

(22) Filed: May 20, 2022

(51) Int. Cl.
 *G11C 11/22* (2006.01)

(52) U.S. Cl.
 CPC ........ *G11C 11/2257* (2013.01); *G11C 11/221* (2013.01); *G11C 11/2255* (2013.01); *G11C 11/2273* (2013.01); *G11C 11/2275* (2013.01)

(58) Field of Classification Search
 CPC .............. G11C 11/2257; G11C 11/221; G11C 11/2255; G11C 11/2273; G11C 11/2275
 See application file for complete search history.

(56) References Cited

U.S. PATENT DOCUMENTS

| 6,310,797 | B1 | 10/2001 | Muneno | |
| 2005/0135143 | A1* | 6/2005 | Jeon | G11C 11/22 365/145 |
| 2017/0256300 | A1* | 9/2017 | Vimercati | G11C 11/221 |

FOREIGN PATENT DOCUMENTS

WO    1995002883 A1    1/1995

* cited by examiner

*Primary Examiner* — Han Yang
(74) *Attorney, Agent, or Firm* — Fletcher Yoder, P.C.

(57) ABSTRACT

Ferroelectric memory arrays with reduced current leakage is described herein. A ferroelectric memory array may include a number of memory cells including capacitors with ferroelectric material. Providing an intermediary word line voltage to non-selected word lines that are not electrically coupled to a target memory cell during a sensing operation may reduce leakage current from an active data line electrically coupled to the target memory cell to the non-selected word lines. The intermediary word line voltage may be provided using an amplitude between an idle voltage of the data lines and zero volts. The intermediary word line voltage may be reduced closer to zero volts for performing a programming operation.

20 Claims, 5 Drawing Sheets

US 11,749,329 B1

OFF-STATE WORD LINE VOLTAGE CONTROL FOR FIXED PLATE VOLTAGE OPERATION

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory devices and more specifically to charge distributions of memory cells of a memory device. The techniques and methods described herein may be used with ferroelectric memory devices or other types of memory devices. Memory devices are widely used to store information in various electronic devices such as computers, wireless communication devices, cameras, digital displays, and the like. Information is stored by programming different states on memory cells of a memory device. For example, binary devices have two states, often denoted by a logic "1" or a logic "0" In other systems, more than two states may be stored. To access the stored information, the electronic device may read, or sense, the stored state in the memory device. To store information, the electronic device may write, or program, the state in the memory device.

BRIEF DESCRIPTION OF THE DRAWINGS

Various aspects of this disclosure may be better understood upon reading the following detailed description and upon reference to the drawings in which.

DETAILED DESCRIPTION

Figure 1:
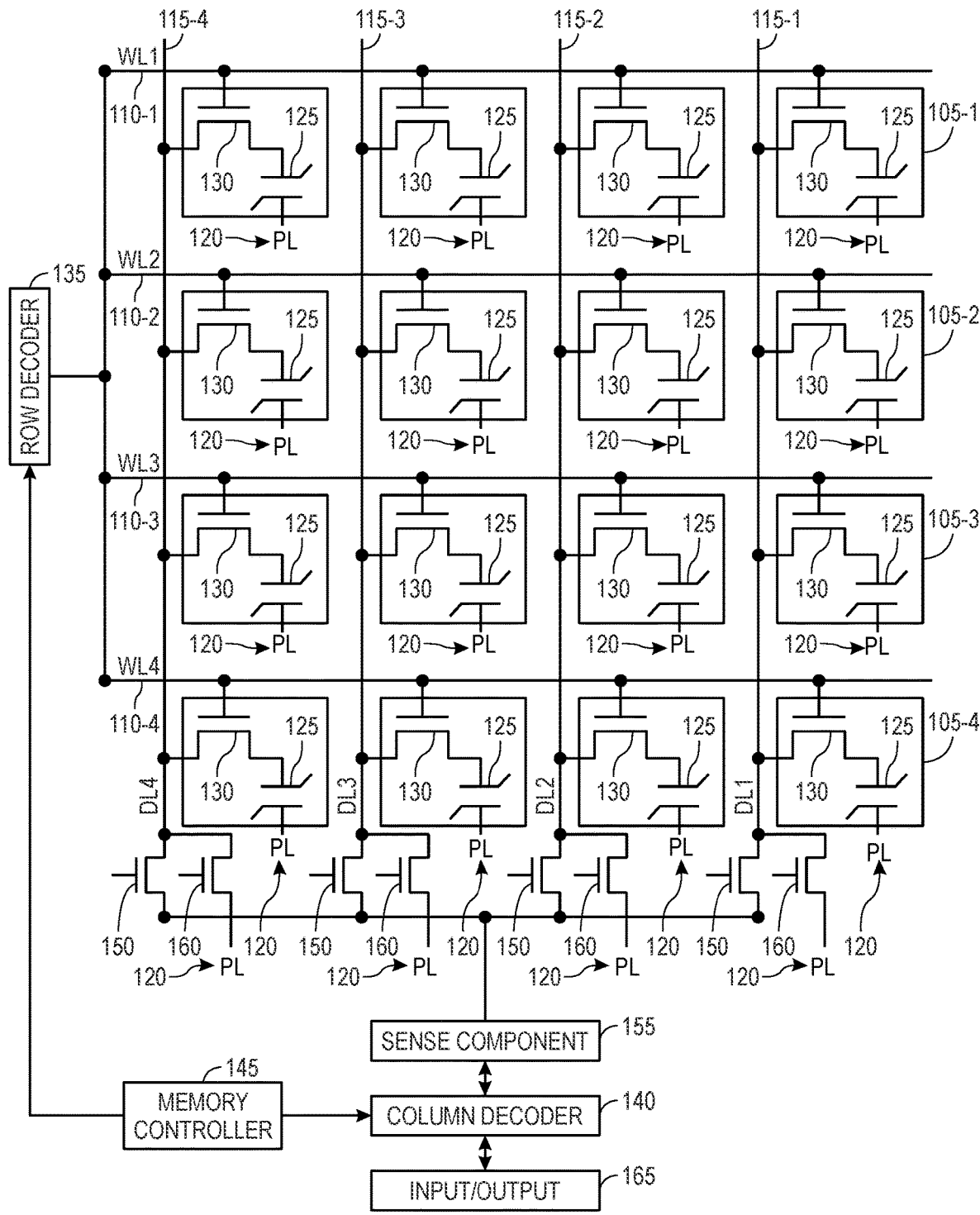
FIG. 1 is a ferroelectric memory array, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A memory device may include a number of memory arrays including a ferroelectric memory array. Every memory array, such as a ferroelectric memory array includes a number of memory cells. The memory cells of a ferroelectric memory device are arranged between a number of word lines and data lines. For example, each of the memory cells is disposed at an intersection of a word line and a data line. Moreover, each memory cell may include a ferroelectric capacitor, hereinafter referred to as a capacitor, and a switch.

A switch of a memory cell in a ferroelectric memory array may couple to a capacitor of the memory cell on a first side of the switch, a respective word line on a second side of the switch, and a respective data line on a third side of the switch. The switch may short a connection between the capacitor and the data line when a voltage of the word line is high (e.g., the word line is selected). In some embodiments, the switch may include a transistor where the word line is coupled to a gate of the transistor to control a connection between the capacitor and the data line.

The memory cells in a ferroelectric memory array may be written to (e.g., in a memory write operation) or may be read from (e.g., in a memory read operation) based on applying a voltage to the respective data line and selecting the word line. For example, a first decoder (e.g., a row decoder) of the ferroelectric memory array may provide the high voltage to a selected word line that is coupled to a target memory cell. In some embodiments, a processor, a memory controller, or any other viable component may provide control signals to the first decoder indicative of selecting the word line that is coupled to the target memory cell. Accordingly, a switch of the target memory cell may short a connection between a capacitor of the target memory cell and a data line coupled to the target memory cell when the word line is selected.

Moreover, a second decoder (e.g., a column decoder) of the ferroelectric memory array may apply the voltage to the data line to sense a memory state of the target memory cell, program a memory state on the target memory cell, or both. Each memory state may correspond to a distinct distribution of charges stored on the memory cells of the ferroelectric memory array. For example, the charge distribution may correspond to each polarity of a dipole charge distribution, an intermediary charge distribution of the dipole charge distribution, among other possible charge distributions. The memory states of the target memory cell may, at least, include a first memory state corresponding to a first stored value on the target memory cell (e.g., logic 0) and a second memory state corresponding to a second stored value on the target memory cell (e.g., logic 1).

Writing a target memory state on a target memory cell in a ferroelectric memory array may include sensing a memory state of the target memory cell (e.g., determining a charge distribution currently stored on the target memory cell). In different cases, writing the target memory state on the target memory cell may or may not include programming the target memory state based on the memory state of the target memory cell and whether sensing the memory state is destructive (i.e., where sensing the memory state drains the charge from the target memory cell, thereby changing the memory state on the target memory cell). Moreover, reading a memory state of a target memory cell in a ferroelectric memory array may also include sensing the memory state of the target memory cell. Reading the memory state of the target memory cell may include re-programming the memory state when sensing the memory state of the target memory cell is destructive.

Sensing the memory state of the target memory cell may include applying a sensing voltage to a data line coupled to the target memory cell and selecting a word line coupled to the target memory cell to determine the charge distribution stored on the target memory cell. Moreover, one or more of remaining word lines of the ferroelectric memory array may remain non-selected, as discussed below. For example, the non-selected word lines receive zero or near zero voltage (e.g., near −0.5 volts (V), near −0.2 V, near −0.15, 0 V, and so on). The second decoder (e.g., the column decoder) of the ferroelectric memory array may apply the sensing voltage to the data line to sense the memory state of the target memory cell. As mentioned above, the switch of the target memory cell may couple the capacitor to the data line when the word line is selected. As such, the capacitor may receive the sensing voltage of the data line when the word line is receiving the high voltage.

The capacitor of the target memory cell may discharge the stored charges based on receiving the sensing voltage. In particular, the second decoder may apply the sensing voltage to extract the stored charges of the capacitor to the data line. The extracted electrical charges of the capacitors may induce a voltage change on the voltage of the data line. For example, the extracted electrical charges may induce a voltage change in the sensing voltage present on the data line when sensing the memory state of the target memory cell.

In some embodiments, a sense component of the ferroelectric memory array may determine the voltage change of the data line that is induced by the extracted charges. For example, the sense component may determine a sensed voltage present on the data line and receive a reference voltage such as the sensing voltage applied to the data line. Moreover, the sense component may compare the reference voltage with the sensed voltage of the data line to determine the voltage change. Subsequently, the sense component may determine (e.g., sense) the memory state of the target memory cell based on the voltage change induced by the extracted charges. For example, a first voltage change value may correspond to a first memory state of the target memory cell (e.g., logic 0) and a second voltage change value may correspond to a second memory state of the target memory cell (e.g., logic 1).

As discussed above, sensing the memory state of the target memory cell may include applying the sensing voltage to the data line coupled to the target memory cell and providing the high voltage to the selected word line when a voltage of the non-selected word lines is zero or near zero. Moreover, the data line is coupled to one or more non-targeted memory cells that are coupled to the non-selected word lines. In some cases, if not accounted for, one or more of the non-targeted memory cells that are coupled to the data line may leak current from the data line to the respective capacitors when the data line is receiving the sensing voltage. The non-targeted memory cells may leak current based on a large voltage difference between the data line and the non-selected word lines when the data line is receiving the sensing voltage.

In specific cases, various manufacturing process variations of the ferroelectric memory array and/or the memory device, real-world property variations of the switches, or a combination of both, among other things, may cause such leakage current. For example, when a switch of a non-targeted memory cell includes an N-channel metal-oxide-semiconductor field-effect transistor (MOSFET), the switch may leak current to the non-selected word line coupled thereto when a drain of the MOSFET receives a high voltage (e.g., the sensing voltage) from the data line.

With the foregoing in mind, a leakage current from the data line may cause erroneous sensing of the memory state of the target memory cell. For example, the leakage current may distort the voltage of the data line causing the sense component to determine an erroneous voltage change induced by the extracted charges. Such errors may interfere with sensing the memory state of the target memory cell, programming the target memory cell, or both. Additionally or alternatively, the leakage current may cause faulty read operations or faulty memory write operations. Systems and methods are described below to reduce such leakage current based on reducing the voltage difference between the data line and the non-selected word lines when the data line is receiving the sensing voltage.

Referring now to FIG. 1, a ferroelectric memory array 100, hereinafter referred to as a memory array 100, is illustrated in accordance with various examples of the present disclosure. The memory array 100 supports reading operations and writing operations in a memory device. For example, an electronic device may include such memory device including the memory array 100. As such, the ferroelectric memory array 100 may include a portion of such memory device and/or electronic device. The memory array 100 includes a number of memory cells 105 (e.g., 105-1, 105-2, 105-3, 105-4) each coupled to a respective word line 110 (e.g., 110-1, 110-2, 110-3, 110-4), a respective data line 115 (e.g., 115-1, 115-2, 115-3, 115-4), and a plate line 120.

In the depicted embodiment, a portion of the memory array 100 is illustrated including four word lines 110 (e.g., WL1, WL2, WL3, WL4) and four data lines 115 (e.g., DL1, DL2, DL3, DL4), However, a total number of the word lines 110 and the data lines 115 depends on the array size. The word lines 110 and the data lines 115 are made of conductive materials. For example, word lines 110 and data lines 115 may be made of metals (such as copper, aluminum, gold, tungsten, etc.), metal alloys, other conductive materials, or the like. In any case, each row of the memory cells 105 is connected to a single word line 110, and each column of the memory cells 105 is connected to a single data line 115.

The memory cells 105 are each programmable to store a memory state. For example, the memory cells 105 may each include a capacitor 125 (e.g., storage device) and a switch 130. The word lines 110 are coupled to and may control the switches 130 of the memory cells 105. For example, the switches 130 may electrically isolate the capacitors 125 of the respective memory cells 105 from the data lines 115. In some embodiments, the switches 130 of the memory cells 105 may include a MOSFET where the word lines 110 may be coupled to the gate of the MOSFET. In such embodiments, selecting (e.g., activating) one or more of the word lines 110 may result in an electrical connection or closed circuit between the capacitors 125 of the memory cells 105 that are coupled to the one or more word lines 110 and the respective data lines 115. In additional or alternative cases, the switches 130 of the memory cells 105 may include any other viable switching circuit (e.g., any type of transistors, logic circuits, among other things).

The capacitors 125 may include a ferroelectric as the dielectric material to store charge levels representative of the programmable memory states. Example ferroelectric materials may include barium titanate ($BaTiO_3$), lead titanate ($PbTiO_3$), lead zirconiumn titanate (PZT), and strontium bismuth tantalate (SBT). The capacitors 125 described herein may include these or other ferroelectric materials. Electric charge distribution within a ferroelectric capacitor may result in accumulation of a net charge at the ferroelectric material's surface that attracts opposite charge through the capacitor terminals. Thus, the respective charge is stored at the interface of the ferroelectric material and the capacitor terminals.

In some embodiments, ferroelectric material may maintain an electric charge distribution in the absence of an electric field. For example, the ferroelectric material may maintain a positive, negative, or in some cases a neutral charge at neutral voltage. The ferroelectric material may realize such electric charge levels by receiving a respective programming or sensing voltage. The respective sensing voltage levels may be applied according to hysteresis curves, as will be appreciated.

In any case, the memory cells 105 may be read or written by applying a voltage across the respective capacitors 125. For example, sensing or programming a target memory cell 105-1 includes applying a sensing voltage or programming voltage, respectively, to the data line 115-1 and providing a high voltage to the word line 110-1 (e.g., selecting the word line 110-1), as will be appreciated.

In some embodiments, the memory array 100 may include only one plate line 120. The plate line 120 may provide a constant voltage (e.g., fixed voltage) to one side of the capacitors 125 of each of the memory cells 105 coupled thereto. In some cases the fixed voltage of the plate line 120 may be half or near half of the voltage of the sensing voltage. The capacitors 125 of the memory cells 105 may be sensed or programmed by applying the sensing voltage or programming voltage to the other side of the capacitors 125 via the respective data lines 115. The sensing voltage and/or the programming voltage of the memory cells 105 may be determined based on the fixed voltage of the plate line 120 and characteristics of the ferroelectric capacitors 125.

Sensing a charge distribution stored on the memory cells 105 may be controlled through a row decoder 135 and a column decoder 140. A memory controller 145 may provide control signals (e.g., instructions) to switches 150 to couple the data lines 115 to the column decoder 140 and/or a sense component 155. The memory controller 145 may also provide control signals to switches 160 to couple the data lines 115 to the plate line 120.

For example, the memory controller 145 may provide the control signals to the switches 150 and/or 160 to couple the data line 115-1 of the target memory cell 105-1 to the column decoder 140 and couple the remaining data lines 115-2, 115-3, and 115-4 to the plate line 120. As such, the column decoder 140 may apply the sensing voltage to the data line 115-1 based on receiving a column address of the target memory cell 105-1 from the memory controller 145. Moreover, the column decoder 140 may apply the sensing voltage to the data line 115-1 based on receiving data, for example input 165, to be written to the target memory cell 105-1 and/or other memory cells 105.

Accordingly, sensing the target memory cell 105-1 includes causing a voltage difference across the capacitor 125 of the target memory cell 105-1. As mentioned above, the plate line 120 is held at a finite voltage when the column decoder 140 applies the sensing voltage to the data line 115-1. Furthermore, capacitors 125 of the memory cells 105 coupled to the remaining data lines 115-2, 115-3, and 115-4 may receive the fixed voltage of the plate line 120 on both sides (e.g., virtually grounded). Similarly, the row decoder 135 may select the word line 110-1 by providing a high voltage (e.g., 4 V, 4.5 V, 5 V, 5.5 V, and so on) to the word line 110-1 based on receiving a row address of the target memory cell 105-1 from the memory controller 145.

In some embodiments, the row decoder 135 may also provide an intermediary word line voltage (e.g., 0.3 V, 0.5 V, 0.6 V, 0.8V, and so on) to remaining or non-selected word lines 110-2, 110-3, and 110-4. The row decoder 135 may provide the intermediary word line voltage to the non-selected word lines 110-2, 110-3, and 110-4 during a sensing operation of the target memory cell 105-1. For example, the row decoder 135 may provide the intermediary word line voltage to the non-selected word lines 110-2, 110-3, and 110-4 when the column decoder 140 is applying the sensing voltage to the data line 115-1.

In some cases, providing the intermediary word line voltage to the non-selected word lines 110-2, 110-3, and 110-4 may reduce a voltage difference on different inputs of the switches 130 of non-targeted memory cells 105-2, 105-3, and 105-4. In particular, the intermediary word line voltage may reduce a voltage difference between a first side of the switches 130 of the non-targeted memory cells 105-2, 105-3, and 105-4 coupled to the non-selected word lines 110-2, 110-3, and 110-4 and a second side of the switches 130 of the non-targeted memory cells 105-2, 105-3, and 105-4 coupled to the data line 115-1 on a second side.

In such cases, when applying the sensing voltage to the data line 115-1, providing the intermediary word line voltage to the non-selected word lines 110-2, 110-3, and 110-4 may reduce a leakage current from the data line 115-1 to the non-targeted memory cells 105-2, 105-3. and 105-4 based on a reduced voltage difference on different inputs of the switches 130 of non-targeted memory cells 105-2, 105-3, and 105-4. Accordingly, sensing the charge distribution stored on the target memory cell 105-1 includes applying the sensing voltage to the data line 115-1, selecting the word line 110-1, and providing the intermediary word line voltage to the non-selected word lines 110-2, 110-3, and 110-4.

The sense component 155 may determine the stored memory state of the memory cells 105. For example, the sense component 155 may receive a reference voltage the sensing voltage) and receive or sense a voltage present on a data line 115 when sensing a respective memory cell 105. Moreover, the sense component 155 may compare the reference voltage and the voltage present on the data line 115-1 to determine the stored memory state of the respective memory cell 105. The sense component 155 may include various transistors or amplifiers in order to detect and amplify a difference in the signals, which may be referred to as latching. The sense component 155 may provide an indication of the sensed memory state of the memory cells 105 through the column decoder 140 as input 165.

For example, when the word line 110-1 is selected, applying the sensing voltage to the data line 115-1 may extract the stored charges on the capacitor 125 of the target memory cell 105-1 onto the data line 115-1, Moreover, discharging the capacitor 125 of the target memory cell 105-1 may induce a change in the voltage present on the data line 115-1. The sense component 155 may determine a value of the voltage change based on comparing a sensed voltage present on the data line 115-1 with the sensing voltage the reference voltage). Moreover, the sense component 155 may determine the stored memory state on the target memory cell 105-1 based on comparing the voltage change to one or more voltage change thresholds.

The memory controller 145 may control the operation (e.g., read, write, re-write, refresh, etc.) of the memory cells 105 through the various components, such as the row decoder 135, the column decoder 140, and the sense component 155. The memory controller 145 may generate row and column address signals in order to activate the desired word line 110 and data. line 115. Moreover, the memory controller 145 may generate various other control signals to perform different operations. For example, the memory controller 145 may generate one or more control signals to control providing the intermediary word line voltage to the non-selected word lines 110-2, 110-3, and 110-4 when sensing the memory state of the target memory cell 105-1.

The memory controller 145 may also provide and control various voltage levels used. during the operation of the memory array 100. In general, the amplitude, shape, or duration of an applied voltage discussed herein may be adjusted or varied and may be different for the various operations for operating the memory array 100. Furthermore, one or multiple memory cells 105 within the memory array 100 may be accessed simultaneously; for example, multiple memory cells 105 of the memory array 100 may be accessed simultaneously during a reset operation in which a group of the memory cells 105 or all the memory cells 105 are set to a single memory state.

Figure 2:
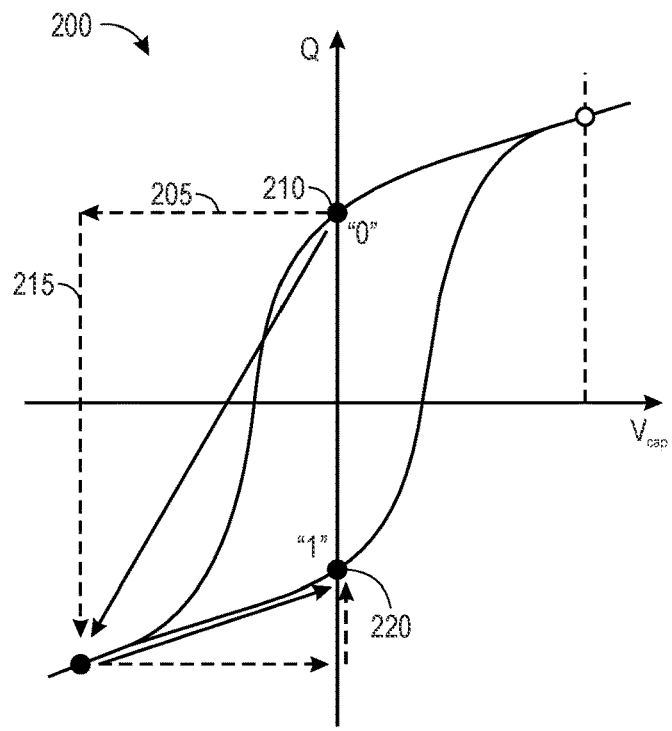
FIG. 2 illustrates a hysteresis curve for sensing a memory cell of the ferroelectric memory array of FIG. 1 having a first memory state initially stored, in accordance with an embodiment of the present disclosure.
Figure 3:
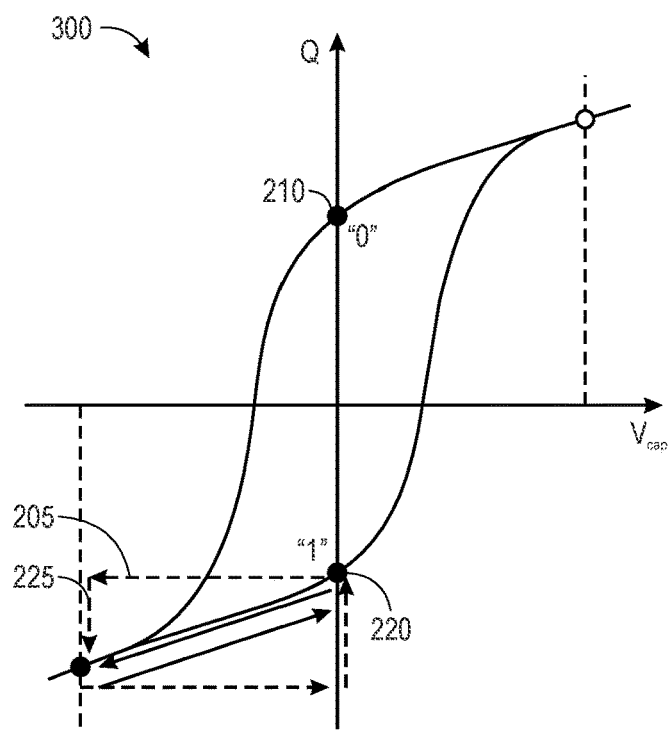
FIG. 3 illustrates a hysteresis curve for sensing a memory cell of the ferroelectric memory array of FIG. 1 having a second memory state initially stored, in accordance with an embodiment of the present disclosure.

FIGS. 2 and 3 illustrate hysteresis curves 200 and 300 for sensing a memory state of the memory cells 105 that include the capacitor 125 with the ferroelectric dielectric material. The hysteresis curves 200 and 300 may illustrate patterns of charge accumulation and storage by the capacitors 125 at different voltage levels across the capacitors 125. In particular, the hysteresis curves 200 and 300 may each illustrate an example sensing process using a high sensing biasing scheme. The high sensing biasing, scheme is based on applying a voltage 205 across the capacitors 125 (e.g., $V_{CAP}$) to extract the stored charges of the capacitors 125. In different cases, biasing schemes for sensing the memory cells 105 may include a low sensing biasing scheme.

By way of example, the hysteresis curve 200 of FIG. 2 may depict a positive charge 210 initially stored on the capacitor 125 of the target memory cell 105-1 at a neutral voltage. In the depicted embodiment, the positive charge 210 represents a logic 0 value stored on the target memory cell 105-1, Applying the voltage 205 across the capacitor 125 may extract first charges 215. For example, the memory controller 145 may provide one or more control signals to apply the voltage 205 across the capacitor 125. As such, the capacitor 125 may receive a data line voltage from the data line 115-1 coupled thereto when the word line 110-1 is selected. Extracting the first charges 215 may induce a first voltage change on the voltage of the data line 115-1.

Subsequently, the capacitor 125 may follow the hysteresis curve 200 to a negative charge 220 when the voltage 205 is removed across the capacitor 125 (e.g., destructive sensing). The negative charge 220 represents a logic 1 value stored on the memory cell 105. In some cases, the memory controller 145 may subsequently provide one or more control signals to re-write the initial logic 1 value to the capacitor 125. For example, the column decoder 140 may apply a positive programming voltage subsequent to removing the 205 to re-write the initial logic 1 value to the capacitor 125.

Moreover, the hysteresis curve 300 of FIG. 3 depicts the negative charge 220 being initially stored on the capacitor 125 at neutral voltage. As mentioned above, the negative charge 220 represents a logic 1 value stored on the memory cell 105. In the depicted embodiment, applying the voltage 205 across the capacitor 125 may extract second charges 225. Extracting the second charges 225 may induce a second voltage change on the voltage of the data line 115-1. However, the second charges 225 may include less extracted charges compared to the first charges 215 of the hysteresis curve 200 discussed above and shown in FIG. 2. Accordingly, the second voltage change associated with sensing the capacitor having an initial logic 1 value may be smaller than the first voltage change associated with sensing the capacitor having an initial logic 0 value.

As mentioned above, the capacitor voltage ($V_{CAP}$) in hysteresis curves 200 and 300 may represent an applied voltage difference across the capacitor 125. For example, when sensing the memory states, a first side of the capacitor 125 may receive the applied voltage (e.g., the voltage 205) from the data lines 115-1 when a second side of the capacitor 125 remains at the voltage of the plate line 120. In some cases, a positive voltage may be realized across the capacitor 125 by applying a voltage higher than the voltage of the plate line 120 (e.g., higher than 1.5 V) to a terminal of the capacitor 125 via the data line 115-1. Similarly, a negative voltage may be realized across the capacitor by applying a voltage less than the voltage of the plate line 120 (e.g., below 1.5 V) to the same terminal of the capacitor 125 via the data line 115-1.

Figure 4:
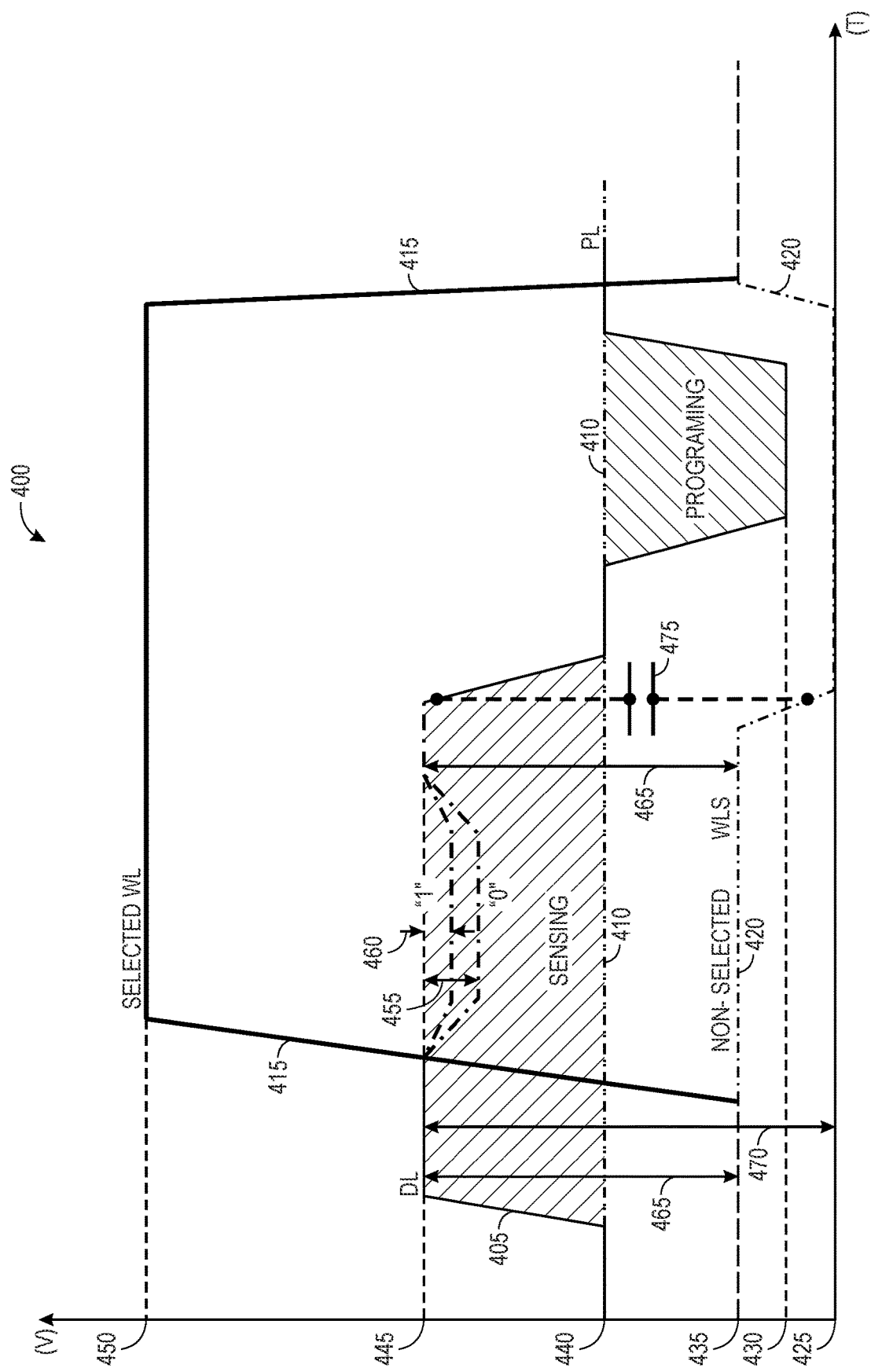
FIG. 4 depicts a graph illustrating voltage levels of data lines and word lines of the ferroelectric memory array of FIG. 1 during a time associated with sensing and programming one or more of the memory cells of the ferroelectric memory array, in accordance with an embodiment of the present disclosure.

With the foregoing in mind, FIG. 4 depicts a graph 400 illustrating voltage levels of the data lines 115 and the word lines 110 of the memory array 100 during a time associated with sensing and programming the memory cells 105. By way of example, the graph 400 is described with respect to the target memory cell 105-1 of the memory array 100 shown in FIG. 1. In particular, a first data line voltage 405 of the data line 115-1, a second data line voltage 410 of the remaining data lines 115-2, 115-3, and 115-4, a first word line voltage 415 of the selected word line 110-1, and a second word line voltage 420 of the non-selected word lines 110-2, 110-3, and 110-4 are depicted with respect to example reference voltage levels.

The reference voltage levels include a low word line voltage 425, a programming voltage 430, an intermediary word line voltage 435, a plate line voltage 440 a sensing voltage 445, and a high word line voltage 450. In some embodiments, the row decoder 135 and the column decoder 140 of FIG. 1 described above may include driver circuitry that may provide the multiple reference voltage levels to the word lines 110 and the data lines 115. Some embodiments associated with the driver circuitry of the row decoder 135 are described below with respect to FIGS. 5 and 6.

In any case, the plate line 120 may have the plate line voltage 440 (e.g., 1.3 V, 1.5 V, 1.6 V, 1.7 V, and so on). The plate line voltage 440 is fixed during the time associated with sensing and programming the memory cells 105 such as the target memory cell 105-1. Each of the capacitors 125 of the memory cells 105 may receive the plate line voltage 440 on one side and may receive the programming voltage 430, the plate line voltage 440, or the sensing voltage 445 on an opposite of the capacitors 125, as will be appreciated. The opposite side of each of the capacitors 125 is coupled to a respective data, line 115.

As mentioned above, in some cases, the remaining data lines 115-2, 115-3, and 1154 that are coupled to the non-targeted memory cells 105 may receive the plate line voltage 440. Accordingly, the second data line voltage 410 of the remaining data lines 115-2, 115-3, and 115-4 may equal to or be close to the plate line voltage 440. As such, although the plate line voltage 440 is nonzero, the capacitors 125 of the non-targeted memory cells 105 may be virtually grounded based on receiving the plate line voltage 440 on both sides.

The data line 115-1 may transition from having the plate line voltage 440 to the sensing voltage 445 (e.g., 2.5 V, 2.7 V, 3 V, 3.2 V, and so on) to sense the memory state of target memory cell 105-1. As described above with respect to the high sensing biasing scheme of FIGS. 2 and 3, applying the sensing voltage 445 to the data line 115-1 may apply a negative voltage (e.g., the 205) across the capacitor ($V_{CAP}$) of the target memory cell 105-1. In the depicted embodiment, the negative voltage across the capacitor ($V_{CAP}$) is based on the sensing voltage 445 being higher than the plate line voltage 440 and also a polarity of the capacitor 125.

In some cases, sensing the memory state of the target memory cell 1054 is destructive. As such, the memory controller 145 may provide one or more control signals to re-write an initial value of the target memory cell 105-1 by providing the programming voltage 430. Accordingly, the data line 115-1 may transition to having the programming voltage 430 (e.g., 0 V, 0.2 V, 0.3 V, and so on) to re-write the initial value of the target memory cell 105-1 on the capacitor 125.

As mentioned above, when sensing the memory state, the capacitor 125 of the target memory cell 105-1 may extract the stored charges associated with the initial memory state to induce a voltage change on the data line 115-1. Moreover, as described above with respect to FIGS. 2 and 3, sensing the memory state of the target memory cell 105-1 may cause extracting a different amount of charges based on the initial memory state of the target memory cell 105-1. For example, sensing the memory state of the target memory cell 105-1 may cause extracting a higher amount of charges (e.g., the first charges 215) when the target memory cell 105-1 is initially storing positive charges associated with the logic 0 value.

When the capacitor 125 of the target memory cell 105-1 is initially storing a logic 0 value, applying the sensing voltage 445 to the capacitor 125 may induce a first voltage change 455 based on extracting the first charges 215. Moreover, when the capacitor 125 is initially storing a logic 1 value, applying the sensing voltage 445 to the capacitor 125 may induce a second voltage change 460 based on extracting the second charges 225. The first voltage change 455 is larger than the second voltage change 460 based on the second charges 225 including less charges to induce a voltage change on the data line 115-1 compared to the first charges 215.

When sensing the memory state of the target memory cell 105-1, the first word line voltage 415 of the selected word line 110-1 and/or the second word line voltage 420 of the non-selected word lines 110-2, 110-3, and 110-4 may transition between multiple reference voltage levels to reduce the leakage current of the memory array 100. In particular, the first word line voltage 415 of the selected word line 110-1 may transition from having the intermediary word line voltage 435 (e.g., 0.3 V, 0.4 V, 0.5 V, 0.6 V, and so on) to a high word line voltage 450 (e.g., 3.5 V, 4.2 V, 4.7 V, 5 V, 5.6 V, and so on) to enable sensing the target memory cell 105-1. Moreover, the second word line voltage 420 of the non-selected word lines 110-2, 110-3, and 110-4 may remain at the intermediary word line voltage 435 during the sensing of the target memory cell 105-1.

The intermediary word line voltage 435 may be selected between the low word line voltage 425 (e.g., −0.2 V, −0.1 V, 0 V, 0.1 V, and so on) and the high word line voltage 450 (e.g., above zero volts, around 5 V, among other voltages). As such, a first differential voltage 465 (e.g., a voltage difference) between the sensing voltage 445 present on the data line 115-1 and the intermediary word line voltage 435 present on the non-selected word lines 110-2, 110-3, and 110-4, is less than a second differential voltage 470 between the sensing voltage 445 of the data line 115-1 and the low word line voltage 425 present on the selected word line 110-1.

In some cases, when providing the sensing voltage 445 to the data line 115-1, a high voltage difference between the data line 115-1 and the non-selected word lines 110-2, 110-3, and 110-4 may result in leakage current through switches 130 of the non-targeted memory cells 105-2, 105-3, and 105-4. Accordingly, providing the intermediary word line voltage 435 to the non-selected word lines 110-2, 110-3, and 110-4 may reduce the leakage current through the switches 130 of the non-targeted memory cells 105-2, 105-3, and 105-4.

The first data line voltage 405 of the data line 115-1 and the second word line voltage 420 of the non-selected word lines 110-2, 110-3, and 110-4 may be reduced (e.g., to zero or near zero volts) during the programming of the target memory cell 105-1. In the depicted embodiment, the first data line voltage 405 of the data line 115-1 is reduced below the intermediary word line voltage 435 to the programming voltage 430. Moreover, to avoid sensing, programming, or otherwise accessing the capacitors 125 of the non-targeted memory cells 105-2, 105-3, and 105-4 coupled to the non-selected word lines 110-2, 110-3, and 110-4, a voltage on a gate of the respective switches 130 (or the second word line voltage of the non-selected word lines 110-2, 110-3, and 110-4) may stay above the first data line voltage 405 of the data line 115-1. As such, the second word line voltage of the non-selected word lines 110-2, 110-3, and 110-4 is also reduced when programming the target memory cell 105-1 according to the high biasing scheme.

In some embodiments, the row decoder 135 of FIG. 1 described above may include a driver circuit that may provide the low word line voltage 425, the intermediary word line voltage 435, and the high word line voltage 450 to the word lines 110. Alternatively or additionally, the row decoder 135 may include a driver circuit that may provide the intermediary word line voltage 435 and the high word line voltage 450 to the word lines 110.

In such cases, an intrinsic capacitance 475 between the data line 115-1 having the first data line voltage 405 and the non-selected word lines 110-2, 110-3, and 110-4 having the second word line voltage 420 may result in reducing the intermediary word line voltage 435 to the low word line voltage 425. For example, such driver circuit may float the voltage of the non-selected word lines 110-2, 110-3, and 110-4 during the programming of the targeted memory cell 105-1 to generate the intrinsic capacitance 475.

Figure 5:
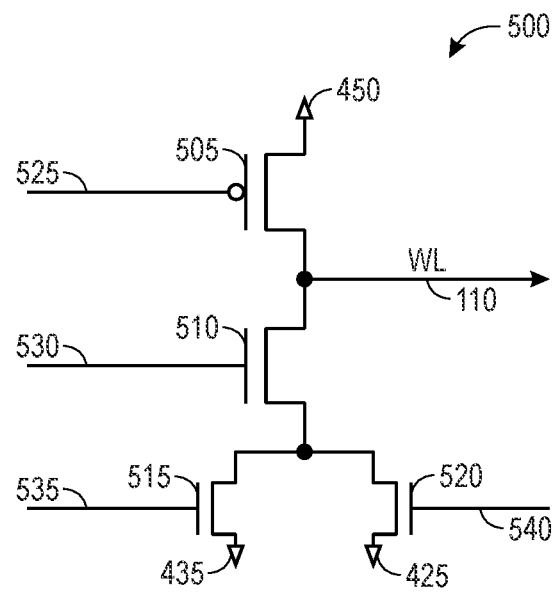
FIG. 5 depicts a schematic of a first driver circuit of the row decoder for providing multiple word line voltages to the non-selected or off-state word lines in the ferroelectric memory array of FIG. 1, in accordance with another embodiment of the present disclosure.

FIG. 5 depicts a schematic of a first driver circuit 500 of the row decoder 135. The first driver circuit 500 is associated with a word line 110 of the memory array 100. Moreover, the first driver circuit 500 may provide the high word line voltage 450, the intermediary word line voltage 435, or the low word line voltage 425 to the word line 110. For example, the first driver circuit 500 may include a first switch 505, a second switch 510, a third switch 515, and a fourth switch 520 to control whether to provide the high word line voltage 450, the intermediary word line voltage 435, or the low word line voltage 425 to the word line 110.

For example, the memory controller 145 of FIG. 1, or any other viable controller or processor, may provide control signals to the first driver circuit 500. For example, the memory controller 145 may provide the control signals to the first switch 505, the second switch 510, the third switch 515, and the fourth switch 520 to control providing the high word line voltage 450, the intermediary word line voltage 435, or the low word line voltage 425 to the word line 110. In particular, the memory controller 145 may provide a first control signal 525 to switch on or off the first switch 505, a second control signal 530 to switch on or off the second switch 510, a third control signal 535 to switch on or off the third switch 515, and a fourth control signal 540 to switch on or off the fourth switch 520.

Moreover, although a specific embodiment of the first driver circuit 500 is illustrated, in different embodiments, the first driver circuit 500 may include a different circuitry, switches, and/or routing for providing the high word line voltage 450, the intermediary word line voltage 435, or the low word line voltage 425 to the word line 110. Furthermore, in different embodiments, the first switch 505, the second switch 510, the third switch 515, and the fourth switch 520 may each include different types of MOSFETs, transistors, or any other viable switching mechanism. Accordingly, each of the first driver circuits 500 in the row decoder 135 may provide the high word line voltage 450, the intermediary word line voltage 435, or the low word line voltage 425 to the respective word line 110 based on the graph 400 to reduce a leakage current through switches 130 of the non-targeted memory cells 105, such as the non-targeted memory cells 105-2, 105-3, and 105-4 of the examples described above.

Figure 6:
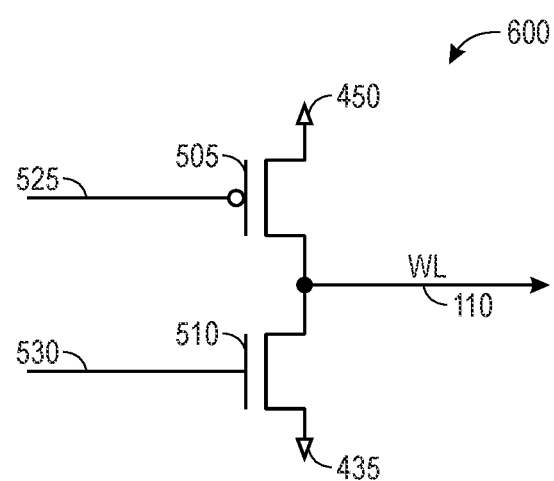
FIG. 6 depicts a schematic of a second driver circuit of the row decoder for providing multiple word line voltages including a floating voltage state to the non-selected or off-state word lines in the ferroelectric memory array of FIG. 1, in accordance with an embodiment of the present disclosure.

FIG. 6 depicts a schematic of a second driver circuit 600 of the row decoder 135. Similarly, the second driver circuit 600 is associated with a word line 110 of the memory array 100. The second driver circuit 600 may provide the high word line voltage 450 or the intermediary word line voltage 435 to the word line 110. In different cases, the row decoder 135 of the memory array 100 may use the first driver circuit 500 for each of the word lines 110, the second driver circuit 500 for each of the word lines 110, or a combination of both and/or other driver circuits to provide the intermediary word line voltage 435 as well as the high word line voltage 450 to the respective word lines 110.

The memory controller 145 of FIG. 1, or any other viable controller or processor, may provide control signals to the second driver circuit 600. The memory controller 145 may provide the control signals to the first switch 505 and the second switch 510 of the second driver circuit 600 to control providing the high word line voltage 450, the intermediary word line voltage 435, or neither voltage when floating the voltage present on the respective word line 110. Accordingly, the memory controller 145 may provide the first control signal 525 to switch on or off the first switch 505 and the second control signal 530 to switch on or off the second switch 510.

Moreover, as discussed above with respect to FIG. 4, a driver circuit, such as the second driver circuit 600, may float the voltage of the non-selected word lines 110-2, 110-3, and 110-4 during the programming of the targeted memory cell 105-1 to generate the intrinsic capacitance 475. As such, the second driver circuit 600 may receive the first control signal 525 and the second control signal to open the first switch 505 and the second switch 510 to float the voltage present on the respective word line 110. For example, when the first switch 505 and the second switch 510 are open, the intrinsic capacitance 475 between the data line 115-1 having the first data line voltage 405 and the non-selected word lines 110-2, 110-3, and 110-4 having the second word line voltage 420 may result in reducing the intermediary word line voltage 435 to the low word line voltage 425.

Figure 7:
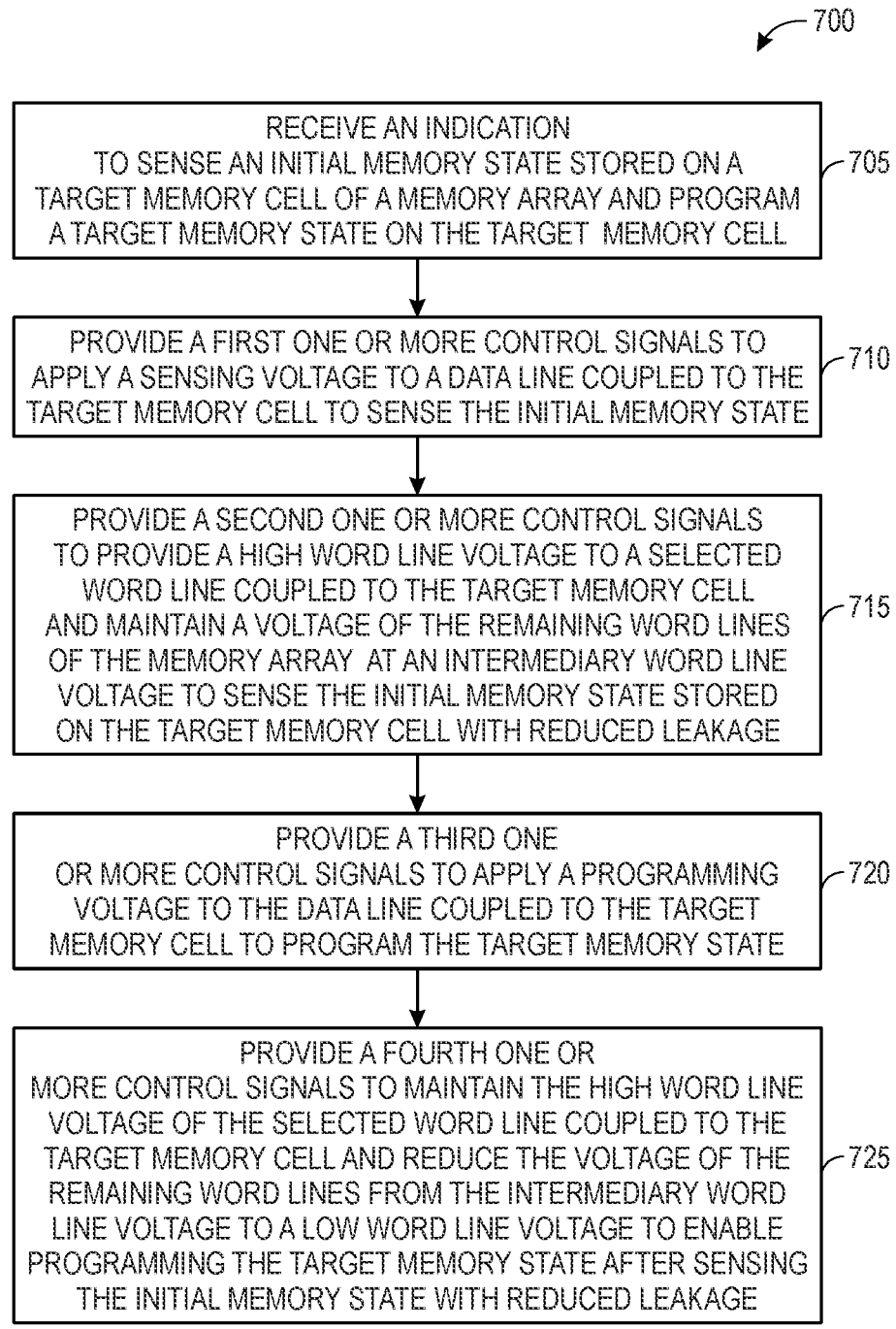
FIG. 7 is a process of sensing and programming a target memory cell of the ferroelectric memory array of FIG. 1, based on reference voltage levels described in FIG. 4, in accordance with an embodiment of the present disclosure.

With the foregoing in mind, FIG. 7 may provide a process 700 of sensing and programming the target memory cell 105-1 of the memory array 100, based on the reference voltage levels described with respect to FIG. 4. In some cases, a memory device may include the memory array 100, the memory controller 145, and the row decoder 135. For example, the memory controller 145 may perform the process 700. Moreover, in specific cases, the row decoder 135 may include the first driver circuit 500 and/or the second driver circuit 600 described with respect to FIGS. 5 and 6. Although the process blocks of the process 700 are described in a particular order, it should be appreciated that the process blocks can be performed in any viable order. Also, in different embodiments, one or more of the process blocks may be removed or additional process blocks may be performed. For example, in some cases, the process 700 may include only sensing the target memory cell 105-1. Furthermore, for simplicity, some aspects of the process 700 are described with respect to the target memory cell 105-1. However, it should be appreciated that the blocks of the process 700 are applicable to any viable memory cell, such as the ferroelectric memory cells 105 of the memory array 100.

At block 705, the memory controller 145 may receive an indication to sense an initial memory state stored on the target memory cell 105-1 of the memory array 100 (a ferroelectric memory array) and program a target memory state on the target memory cell 105-1, For example, the indication may be associated with a destructive, sensing operation requiring re-writing a destructed memory state after the sensing operation. Alternatively, the indication may be associated with a write operation including a non-destructive sensing operation followed by a programming operation.

At block 710, the memory controller 145 may provide a first one or more control signals to apply a sensing voltage to the data line coupled to the target memory cell 105-1 to sense the initial memory state of the target memory cell 105-1. For example, the memory controller 145 may provide the first one or more control signals to the column decoder 140 of the memory array 100 described with respect to FIG. 1.

At block 715, the memory controller 145 may provide a second one or more control signals to provide the high word line voltage 450 to the selected word line 110-1 coupled to the target memory cell 105-1. The memory controller 145 may also provide the second one or more control signals to maintain a voltage of the remaining or non-selected word lines 110-2, 110-3, and 110-4 of the memory array 100 at the intermediary word line voltage 435. As such, the first differential voltage 465 is reduced (e.g., compared to the second differential voltage 470) during the sensing operation to reduce possible leakage current through the switches 130 of the non-targeted memory cells 105, as described above. Accordingly, the second one or more control signals may cause sensing the initial memory state stored on the target memory cell 105-1 with reduced leakage current.

At block 720, the memory controller 145 may provide a third one or more control signals to apply the programming voltage 430 to the data hue 115-1 coupled to the target memory cell 105-1 to program the target memory state. At process block 725, the memory controller 145 may provide a fourth one or more control signals to maintain the high word line voltage 450 of the selected word line 110-1 and reduce the voltage of the remaining or non-selected word lines 110-2, 110-3, and 110-4. In particular, the fourth one or more control signals may reduce the voltage of the remaining or non-selected word lines 110-2, 110-3, and 110-4 to the low word line voltage 425 to enable programming the target memory state on the target memory cell 105-1.

For example, the fourth control signals may reduce a voltage of the gate of the switches 130 of the non-targeted memory cells 105 coupled to the non-selected word lines 110-2, 110-3, and 110-4 to prevent sensing, programming, or otherwise accessing the non-targeted memory cells 105. Moreover, in some cases, the memory controller 145 may provide the second one or more control signals and the fourth one or more control signals to the first driver circuit 500 and/or the second driver circuit 600 of FIGS. 5 and/or 6. In such cases, the second one or more control signals and the fourth one or more control signals may correspond to the first control signal 525, the second control signal 530, the third control signal 535, and the fourth control signal 540.

Technical effects of the described ferroelectric memory array include higher product reliability and efficient power consumption which in turn may result in faster memory operations. With these technical effects in mind, multiple ferroelectric memory arrays may be included on a memory device, which in turn may be included in a memory module. Moreover, a memory controller may be used on the host-side of a memory-host interface; for example, a processor, microcontroller, field programmable gate array (FPGA), application-specific integrated circuit (ASIC), or the like may each include a memory controller.

This communication network may enable data communication there between and, thus, the client device to utilize hardware resources accessible through the memory controller. Based at least in part on user input to the client device, processing circuitry of the memory controller may perform one or more operations to facilitate the retrieval or transmission of data using multiple memory states between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, memory controller operations, and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A ferroelectric memory array, comprising:
a plurality of word lines;
a plurality of data lines;
a plate line configured to have a plate line voltage higher than zero volts;
a plurality of memory cells, wherein a target memory cell of the plurality of memory cells is coupled to a data line of the plurality of data lines, a word line of the plurality of word lines, and the plate line;
a column decoder configured to apply a sensing voltage higher than the plate line voltage to the data line coupled to the target memory cell; and
a row decoder configured to:
provide an intermediary word line voltage higher than zero volts and lower than the plate line voltage to the plurality of word lines; and
provide a high word line voltage higher than the plate line voltage to the word line coupled to the target memory cell.

2. The ferroelectric memory array of claim 1, wherein the target memory cell comprises a switch and a ferroelectric capacitor, wherein the ferroelectric capacitor is coupled to the switch on a first side and coupled to the plate line on a second side to receive the plate line voltage.

3. The ferroelectric memory array of claim 2, wherein the switch is configured to couple the first side of the ferroelectric capacitor to the data line when the row decoder provides the high word line voltage to the word line coupled to the target memory cell.

4. The ferroelectric memory array of claim 2, wherein the switch comprises a transistor or metal-oxide-semiconductor field-effect transistor, wherein the word line coupled to the target memory cell is coupled to a gate of the transistor.

5. The ferroelectric memory array of claim 1, wherein the row decoder comprises a driver circuit, wherein the driver circuit is configured to receive one or more control signals to select between:
providing the intermediary word line voltage to the word line coupled to the target memory cell;
providing the high word line voltage to the word line coupled to the target memory cell; and
floating the word line coupled to the target memory cell.

6. The ferroelectric memory array of claim 5, wherein the driver circuit is configured to float the word line coupled to the target memory cell in response to receiving the one or more control signals indicative of programming a memory state on the target memory cell.

7. The ferroelectric memory array of claim 1, wherein the row decoder comprises a driver circuit, wherein the driver circuit is configured to receive one or more control signals to select between:
provide the intermediary word line voltage to the word line coupled to the target memory cell;
providing the high word line voltage to the word line coupled to the target memory cell; and
providing a low word line voltage lower than the intermediary word line voltage to the word line coupled to the target memory cell.

8. The ferroelectric memory array of claim 7, wherein the driver circuit is configured to provide the low word line voltage coupled to the target memory cell in response to receiving the one or more control signals indicative of programming a memory state on the target memory cell.

9. A memory device, comprising:
a memory controller configured to provide one or more control signals to sense a memory state stored on a memory cell, program a memory state on the memory cell, or both;
a plurality of memory arrays comprising a ferroelectric memory array, wherein the ferroelectric memory array comprises:
a plurality of word lines;
a plurality of data lines;
a plate line configured to have a plate line voltage higher than zero volts;
a plurality of memory cells, wherein each memory cell of the plurality of memory cells is coupled to a respective data line of the plurality of data lines, a respective word line of the plurality of word lines, and the plate line;
a column decoder configured to:
apply a sensing voltage higher than the plate line voltage to one or more of the plurality of data lines; and
apply a programming voltage lower than the plate line voltage to one or more of the plurality of data lines; and
a row decoder configured to:
provide an intermediary word line voltage higher than zero volts and lower than the plate line voltage to the plurality of word lines; and
provide a high word line voltage higher than the plate line voltage to at least one of the plurality of word lines.

10. The memory device of claim 9, wherein the memory controller is configured to provide the one or more control signals indicative of sensing a memory state stored on a target memory cell of the plurality of memory cells.

11. The memory device of claim 10, wherein:
the column decoder is configured to provide the sensing voltage to a data line of the plurality of data lines coupled to the target memory cell in response to the one or more control signals; and
the row decoder is configured to:
provide the high word line voltage to a word line of the plurality of word lines coupled to the target memory cell; and
provide a low word line voltage lower than the intermediary word line voltage to the remaining word lines of the plurality of word lines in response to the one or more control signals.

12. The memory device of claim 9, wherein the memory controller is configured to provide the one or more control signals indicative of programming a memory state on a target memory cell of the plurality of memory cells, wherein the column decoder is configured to provide the programming voltage to a data line of the plurality of data lines coupled to the target memory cell in response to the one or more control signals.

13. The memory device of claim 12, wherein the row decoder is configured to provide the high word line voltage to a word line of the plurality of word lines coupled to the target memory cell and provide a low voltage lower than the intermediary word line voltage to remaining word lines of the plurality of word lines in response to the one or more control signals.

14. The memory device of claim 12, wherein the row decoder is configured to provide the high word line voltage to a word line of the plurality of word lines coupled to the target memory cell and float one or more of remaining word lines of the plurality of word lines in response to the one or more control signals, wherein floating the one or more of remaining word lines causes a low voltage lower than the intermediary word line voltage on the one or more of remaining word lines.

15. A method, comprising:
receiving, by a memory controller of a ferroelectric memory array, an indication to sense an initial memory state stored on a target memory cell of the ferroelectric memory array and program a target memory state on the target memory cell;
providing, by the memory controller, a first one or more control signals indicative of applying a sensing voltage to a data line coupled to the target memory cell to sense the initial memory state;
providing, by the memory controller, a second one or more control signals indicative of providing a high word line voltage to a selected word line coupled to the target memory cell and maintaining an intermediary word line voltage of remaining word lines of the memory array to sense the initial memory state stored on the target memory cell with reduced leakage;
providing, by the memory controller, a third one or more control signals to apply a programming voltage to the data line coupled to the target memory cell to program the target memory state; and
providing, by the memory controller, a fourth one or more control signals indicative of maintaining the high word line voltage of the selected word line coupled to the target memory cell and reducing the voltage of the remaining word lines from the intermediary word line voltage to a low word line voltage less than the intermediary word line voltage to enable programming the target memory state after sensing the initial memory state with reduced leakage.

16. The method of claim 15, wherein sensing the initial memory state stored on the target memory cell and programing the target memory state on the target memory cell are associated with a memory read operation or a memory write operation of the target memory cell.

17. The method of claim 15, wherein the first one or more control signals are further indicative of maintaining a voltage of one or more remaining data lines not coupled to the target memory cell at a plate line voltage, wherein the plate line voltage is higher than zero volts and less than the sensing voltage.

18. The method of claim 17, wherein the intermediary word line voltage is higher than zero volts and lower than the plate line voltage.

19. The method of claim 15, wherein a decoder of the ferroelectric memory array is configured to provide the high word line voltage to the selected word line and provide the intermediary word line voltage to the remaining word lines in response to the memory controller providing the second one or more control signals.

20. The method of claim 15, comprising providing the fourth one or more control signals to float a voltage of the remaining word lines or provide the low word line voltage to reduce the voltage of the remaining word lines.

* * * * *